United States Patent
Hidaka et al.

(10) Patent No.: US 9,994,955 B2
(45) Date of Patent: Jun. 12, 2018

(54) RAW MATERIAL VAPORIZATION AND SUPPLY APPARATUS

(71) Applicant: FUJIKIN INCORPORATED, Osaka (JP)

(72) Inventors: Atsushi Hidaka, Osaka (JP); Masaaki Nagase, Osaka (JP); Satoru Yamashita, Osaka (JP); Kouji Nishino, Osaka (JP); Nobukazu Ikeda, Osaka (JP)

(73) Assignee: FUJIKIN INCORPORATED, Osak (JP)

( * ) Notice: Subject to any disclaimer, the term of this patent is extended or adjusted under 35 U.S.C. 154(b) by 412 days.

(21) Appl. No.: 14/650,496

(22) PCT Filed: Nov. 20, 2013

(86) PCT No.: PCT/JP2013/006812
§ 371 (c)(1),
(2) Date: Jun. 8, 2015

(87) PCT Pub. No.: WO2014/087592
PCT Pub. Date: Jun. 12, 2014

(65) Prior Publication Data
US 2015/0322567 A1 Nov. 12, 2015

(30) Foreign Application Priority Data

Dec. 6, 2012 (JP) .................................. 2012-267021

(51) Int. Cl.
*F22B 1/28* (2006.01)
*F24H 1/18* (2006.01)
(Continued)

(52) U.S. Cl.
CPC ...... *C23C 16/4485* (2013.01); *C23C 16/4481* (2013.01); *C23C 16/4482* (2013.01);
(Continued)

(58) Field of Classification Search
None
See application file for complete search history.

(56) References Cited

U.S. PATENT DOCUMENTS 8,128,073 B2 * 3/2012 Gregg ................. C23C 16/4481
261/142
8,724,974 B2 * 5/2014 Ohmi ....................... F22B 1/284
392/389
(Continued)

FOREIGN PATENT DOCUMENTS

JP         8-288282 A    11/1996
JP    2005-286054 A    10/2005
(Continued)

OTHER PUBLICATIONS

International Search Report issued in corresponding application PCT/JP2013/006812, completed Dec. 9, 2013 and dated Dec. 24, 2013.

*Primary Examiner* — Thor Campbell
(74) *Attorney, Agent, or Firm* — Griffin and Szipl PC

(57) ABSTRACT

The present invention provides a raw material vaporization and supply device including a raw material receiving tank, a vaporizer for vaporizing liquid pressure-fed from the liquid receiving tank, a flow rate control device for adjusting a flow rate of raw material gas from the vaporizer, and a heating device for heating the vaporizer, the high-temperature pressure-type flow rate control device, and desired sections of flow passages connected to these devices, wherein $Al_2O_3$ passivation treatment, $Cr_2O_3$ passivation treatment, or $FeF_2$ passivation treatment is applied to liquid contact parts or gas contact parts of metal surfaces of at least any of the raw material receiving tank, the vaporizer, the flow rate control device, the flow passages that links these (Continued)

component devices, or opening-and-closing valves that are disposed in the flow passages.

14 Claims, 13 Drawing Sheets

(51) Int. Cl.
  *C23C 16/448* (2006.01)
  *F17C 9/02* (2006.01)
  *C23C 16/52* (2006.01)

(52) U.S. Cl.
  CPC ............... *C23C 16/52* (2013.01); *F17C 9/02* (2013.01); *F22B 1/284* (2013.01); *F22B 1/285* (2013.01)

(56) References Cited

U.S. PATENT DOCUMENTS

| | | | |
|---|---|---|---|
| 2006/0071192 A1 | 4/2006 | Ohmi et al. | |
| 2008/0191153 A1* | 8/2008 | Marganski | B01J 7/00 250/492.21 |
| 2008/0220164 A1* | 9/2008 | Bauch | C23C 16/4485 427/248.1 |
| 2009/0095068 A1* | 4/2009 | Redemann | G01F 1/6842 73/202 |
| 2009/0238968 A1* | 9/2009 | Hatanaka | B05D 1/60 427/237 |
| 2009/0321936 A1* | 12/2009 | Kojima | H01L 21/28556 257/751 |
| 2010/0012026 A1* | 1/2010 | Hirata | C23C 16/4481 118/666 |
| 2010/0025852 A1* | 2/2010 | Ueki | C23C 16/30 257/761 |
| 2010/0203417 A1* | 8/2010 | Venkataraman | B01J 8/0257 429/465 |
| 2010/0219512 A1* | 9/2010 | Tada | H01L 21/02274 257/632 |
| 2011/0100483 A1* | 5/2011 | Nagata | B01B 1/005 137/334 |
| 2013/0084059 A1* | 4/2013 | Ohmi | F22B 1/284 392/389 |
| 2014/0124064 A1 | 5/2014 | Hidaka et al. | |
| 2014/0190581 A1* | 7/2014 | Nagase | C23C 16/448 137/624.27 |
| 2014/0216339 A1 | 8/2014 | Nagase et al. | |

FOREIGN PATENT DOCUMENTS

| | | |
|---|---|---|
| JP | 4085012 B | 2/2008 |
| JP | 2009-252760 A | 10/2009 |
| JP | 4605790 B | 10/2010 |
| JP | 2012-234860 A | 11/2012 |
| JP | 2013-033782 A | 2/2013 |
| WO | 20071036997 A1 | 4/2007 |

* cited by examiner

Prior Art

US 9,994,955 B2

RAW MATERIAL VAPORIZATION AND SUPPLY APPARATUS

This is a National Phase Application in the United States of International Patent Application No. PCT/JP2013/006812 filed Nov. 20, 2013, which claims priority on Japanese Patent Application No. 2012-267021, filed Dec. 6, 2012. The entire disclosures of the above patent applications are hereby incorporated by reference.

TECHNICAL FIELD OF THE INVENTION

The present invention relates to improvements in a raw material vaporization and supply apparatus utilizing so-called metal organic chemical vapor deposition method (hereinafter referred as MOCVD method) for semiconductor manufacturing equipment, and relates to a raw material vaporization and supply apparatus that heats a solid, liquid, or gaseous organic metal raw material to a desired high temperature to stably and continuously supply raw material gas with a high vapor pressure without causing pyrolysis.

BACKGROUND OF THE INVENTION (ART)

Conventionally, many bubbling-type vaporization and supply apparatuses have been used as a raw material vaporization and supply apparatus by the MOCVD method for semiconductor manufacturing equipment. However, the bubbling method has a lot of problems in flow rate control of raw material gas to be supplied, concentration control of the raw material gas, and a vapor pressure of the raw material gas etc., and therefore, the inventors disclosed a vaporizer-type raw material vaporization and supply apparatus with a pressure-type flow rate control device for controlling a flow rate of raw material gas to solve the problems (Japanese Unexamined Patent Application Publication No. 2009-252760). In addition to the vaporizer-type raw material vaporization and supply apparatus, the inventors are developing a baking-type raw material vaporization and supply apparatus with a pressure-type flow rate control device for controlling a flow rate of raw material gas (Japanese Unexamined Patent Application Publication No. 2013-33782, Japanese Unexamined Patent Application Publication No. 2012-234860 etc).

FIG. 9 is a block diagram illustrating the vaporizer-type raw material vaporization and supply apparatus that has a raw material receiving tank T, a supply flow rate control device Q, a vaporizer 1, a high-temperature pressure-type flow rate control device 2, and a heating device 6 ($6a$, $6b$, $6c$ etc.), and the vaporizer 1 and the high-temperature pressure-type flow rate control device 2 constitute an essential part of the raw material vaporization and supply apparatus. In FIG. 9, reference symbol M designates a heating temperature control device, reference symbol $V_1$ designates a fluid supply flow rate control valve, reference symbol L designates a relief valve, reference symbol Gp designates gas for pressurizing the raw material receiving tank, reference symbol LG designates a raw material liquid, reference symbol G designates raw material gas, reference symbols $T_0$ and $T_1$ designate temperature detectors, reference symbols $V_2$ to $V_7$ designate opening-and-closing valves, reference symbols $P_0$ and $P_1$ designate pressure detectors, reference symbol 3 designates a vaporizing chamber, reference symbol 4 designates a pulsation reducing orifice, reference symbol 5 designates a liquid storing part, reference symbols 7 and 8 designate flow passages, and reference symbol 9 designates a buffer tank.

FIG. 10 is a perspective view of a longitudinal section of the vaporizer 1 shown in FIG. 9, and reference symbol $3d$ designates a raw material liquid inlet, reference symbols $3f$ and $3g$ designate heating promoters, reference symbol $3e$ designates a gas outlet, and reference symbol $4a$ designates a hole. FIG. 11 is a perspective view of a combined structure of the vaporizer 1 and the high-temperature pressure-type flow rate control device 2 shown in FIG. 9, and the high-temperature pressure-type flow rate control device 2 is mounted and fixed on top of the vaporizing chamber 3 that is surrounded by a heating board 11 with a heater 10. Here, reference symbol $2a$ designates a main body of the flow rate control device.

In the vaporizer 1 shown in FIG. 9, a supply flow rate of the liquid LG from the raw material receiving tank T is controlled by adjusting an internal pressure of the tank T and an opening degree of the fluid supply flow rate control valve $V_1$ via the supply flow rate control device Q, and the supply flow rate of the liquid LG is controlled by a signal emitted from the pressure detector $P_0$ located at an outlet side of the vaporizer 1 to have a gas pressure at an upstream side of the high-temperature pressure-type flow rate control device 2 be no lower than a predetermined pressure value. Similarly, input to a heater of the heating device $6a$ and control of the opening degree of the fluid supply flow rate control valve $V_1$ are conducted via the heating temperature control device M by signals emitted from the heating temperature detector $T_0$ of the vaporizer 1, and the gas pressure at the upstream side of the high-temperature pressure-type flow rate control device 2 is controlled to be no lower than the intended pressure value by the supply flow rate control device Q and the heating temperature control device M.

In the vaporizer-type raw material vaporization and supply apparatus, since raw material gas that is vaporized in the vaporizer 1 is controlled by the high-temperature pressure-type flow rate control device 2 that can stably control a flow rate, precision of flow rate control is not affected at all even a temperature or a pressure condition at a side of the vaporizer 1 slightly fluctuates. Therefore, even in a condition where precision of controls of the temperature and the pressure (flow-in rate of the liquid) at the side of the vaporizer 1 slightly lowers, precision of the flow rate control of the raw material gas G does not drop and highly precise gas flow rate control can be stably conducted.

There are more advantages available: an internal pressure of the vaporizing chamber 3 fluctuates less because the internal space of the vaporizing chamber 3 of the vaporizer 1 is divided into a plurality of areas by the pulsation reducing orifice 4; gas is stably supplied to the high-temperature pressure-type flow rate control device 2 because the internal space of the vaporizing chamber 3 serves as a buffer tank; liquid portion is stably vaporized by heating the vaporizing chamber 3 evenly; and recondensation of the gas in the flow rate control device main body $2a$ is perfectly prevented by keeping a temperature difference at a gas contact part in the high-temperature pressure-type flow rate control device 2 within about 6° C.

On the other hand, the baking-type raw material vaporization and supply apparatus that is currently under development by the inventors includes a raw material receiving tank T that stores a raw material liquid LG, a constant temperature heating device 12 that heats the raw material receiving tank T etc, and a pressure-type flow rate control device 2 that controls a flow rate of raw material gas G which is supplied from an internal upper space Ta of the raw material receiving tank T to a process chamber 13 as shown in a block diagram of FIG. 12. Here, in FIG. 12, reference symbol 14 designates a raw material liquid supply port, reference symbol 15 designates a purge gas supply port, reference symbol 16 designates a diluent gas supply port, reference symbol 17 designates a gas supply port for another thin-layer forming gas, reference symbols 18, 19, and 20 designate flow passages, and reference symbols $V_8$ to $V_{16}$ designate valves.

The raw material receiving tank T is filled with a moderate amount of the liquid raw material (such as an organic metal compound like TMGa) or a solid raw material (such as TMIn powder or an organic metal compound supported by a porous support body), and the raw material is heated by a heater in the constant temperature heating device 12 (not shown) to a temperature between 40° C. and 220° C. to fill the internal space Ta of the raw material receiving tank T with raw material vapor $G_0$ of the raw material liquid LG or the solid raw material with a saturated vapor pressure which is generated at a reached temperature.

Then, the generated raw material vapor $G_0$ flows into the pressure-type flow rate control device 2 through the raw material vapor outlet valve $V_9$ and the raw material gas G of which flow rate is controlled by the pressure-type flow rate control device 2 to be a predetermined flow rate is supplied to the process chamber 13. Purge gas Gp such as $N_2$ for purging flow passages of the raw material gas G or the like is supplied from the purge gas supply port 15 and diluent gas $G_1$ such as helium, argon, or hydrogen is supplied from the diluent gas supply port 16 as needed. Since the flow passages for the raw material gas G is heated to a temperature between 40° C. and 220° C. by the constant temperature heating device 12, the raw material gas G is not recondensed.

FIG. 13 is a sectional view schematically illustrating an essential part of the baking-type raw material vaporization and supply apparatus, and the high-temperature pressure-type flow rate control device 2 is mounted and fixed on top of the raw material receiving tank T to lead the raw material vapor $G_0$ in the raw material tank T directly to the high-temperature pressure-type flow rate control device 2 that controls a flow rate of the vapor and supplies it to the process chamber 13 (not shown).

For the baking-type raw material vaporization and supply apparatus, it is possible to supply the only pure raw material gas G to the process chamber 13 all the time and this allows a raw material vapor concentration to be controlled easily and highly precisely. Additionally, by using the high-temperature pressure-type flow rate control device 2, clogging due to condensation of the raw material gas G which is seen in use of a mass flow rate control device (thermal-type mass flow rate control device) is eliminated and more stable supply of the raw material gas G may be realized comparing to a raw material vaporization and supply apparatus with the thermal-type mass flow rate control device. Furthermore, there are more advantages available such as highly precise flow rate control even in a slight fluctuation of a vapor pressure of the raw material vapor $G_0$ in the raw material receiving tank T and a major reduction in size as well as in production cost of the raw material vaporization and supply apparatus.

However, there are still a lot of problems to be solved left even in the vaporizer-type raw material vaporization and supply apparatus as well as the baking-type raw material vaporization and supply apparatus. Firstly, there is a problem about pyrolysis of the raw material gas G. Generally in a semiconductor processing apparatus, stable supply of the high purity raw material gas G with a higher vapor pressure is desired for preventing recondensation of process gas at some point in the pipelines or for processing efficiency. Specifically, the raw material gas G needs to be heated to a quite high temperature to generate a high vapor pressure like 200 kpa abs which is desired in some cases and, for example, a temperature to be heated to for obtaining the vapor pressure of 200 kPa abs and then to be maintained at is 200° C. in case the raw material gas is TEOS, 150° C. in case of TEB, 150° C. in case of TMIn, 140° C. in case of DEZn, and 160° C. in case of $TiCl_4$.

However, there is a weak point that gases of some organic metal raw materials for semiconductor production are pyrolyzed below their boiling points by contacts with metal materials and therefore, not all the organic metal raw materials may be stably supplied.

Also, many component devices that constitute the raw material vaporization and supply apparatus include valve elements and/or sealants of various opening-and-closing valves made of a resin material that contact with the gas. However, whether contacts with those resin-made parts cause pyrolysises of the raw material gases and, in case pyrolysises are caused, then heating temperatures at which the raw material gases are pyrolyzed have not been investigated at all. This is the other remaining issue in stable supply of the organic metal raw material gases.

Of course, so-called passivation treatment techniques (Japanese Patent No. 4085012etc.) have been developed and widely used for inhibiting emission of particles from outer surfaces of metal-made passages as well as component devices and for preventing pyrolysises of process gases by controlling catalytic action of the outer metal surfaces. However, the conventional passivation techniques of this type are for pipelines and component devices used for gases at low temperatures below 100° C. to 120° C. and there is a problem remained that prevention effects of the passivation treatments on raw material gas pyrolysis etc. when applied to pipelines and component devices used for organic metal raw material gases at high temperatures over 150° C. have not been sufficiently analyzed.

Prior Art Documents (Patent Documents)

Patent document 1: Japanese Patent No. 4605790; Patent document 2: Japanese Unexamined Patent Application Publication No. 2009-252760; and Patent document 3: Japanese Patent No. 4085012

Problems to be Solved by the Invention

It is a main object of the present invention to solve the above described problems in raw material vaporization and supply apparatuses including one disclosed in Japanese Unexamined Patent Application Publication No. 2009-252760 and problems related to effects of conventional passivation treatment techniques etc: pyrolysises of gases are caused below boiling points of raw materials by contacts with metal materials; not all raw material gases of organic metal materials may be stably supplied with high purities as well as high pressures because conditions of contacts between various metals or resin materials and the raw material gases that cause decompositions of the raw material gases are not fully clarified; and raw material gas pyrolysises cannot be stably prevented by the passivation treatments because the effects of the treatments in cases when the raw material gases become high temperatures over 150° C. have not been sufficiently analyzed. The present invention also enables all the raw material gases of the organic metal materials with desired high vapor pressures to be stably and continuously vaporized and supplied at highly precisely controlled flow rates while simplifying a structure and lowering a production cost of the apparatus.

SUMMARY OF THE INVENTION

Means of Solving the Problems

A raw material vaporization and supply apparatus in accordance with one aspect of the present invention defined in claim 1 has a basic configuration including a raw material receiving tank T, a vaporizer 1 for vaporizing a liquid LG pressure-fed from the raw material receiving tank T, a flow rate control device 2 for adjusting a flow rate of raw material gas G from the vaporizer 1, and a heating device 6 for heating the vaporizer 1, the flow rate control device 2, and desired sections of flow passages that are connected to the vaporizer 1 and the flow rate control device 2, wherein a passivation treatment is applied to liquid contact parts or gas contact parts of at least any of the raw material receiving tank T, the vaporizer 1, the flow rate control device 2, the flow passages that connect those component devices, or opening-and-closing valves that are disposed in the flow passages.

A raw material vaporization and supply apparatus in accordance with another aspect of the present invention defined in claim 2 has a basic configuration including a raw material receiving tank T that stores a raw material, a flow passage 18 that supplies the raw material to the raw material receiving tank T, flow passages 19 and 20 that supply raw material gas G from an internal upper space Ta of the raw material receiving tank T to a process chamber 13, a flow rate control device 2 that controls a flow rate of the raw material gas supplied to the process chamber 13, and a constant temperature heating device 12 that heats the raw material receiving tank T, the raw material gas flow passages, and the flow rate control device 2 to a predetermined temperature, wherein a passivation treatment is applied to liquid contact parts or gas contact parts of at least any of the raw material receiving tank, the flow rate control device, the flow passages that connect those component devices, or opening-and-closing valves that are disposed in the flow passages.

In accordance with the other aspect of the present invention defined in claim 3, in the invention according to claim 1 or claim 2, the passivation treatment applied to the liquid contact parts or the gas contact parts of the metal surfaces is $Al_2O_3$ passivation treatment, $Cr_2O_3$ passivation treatment, or $FeF_2$ passivation treatment.

In accordance with the other aspect of the present invention defined in claim 4, in the invention according to claim 1 or claim 2, the flow rate control device 2 is a high-temperature pressure-type flow rate control device.

In accordance with the other aspect of the present invention defined in claim 5, in the invention according to claim 1, a main body 2a of the flow rate control device 2 is mounted on top of a vaporizing chamber 3 of the vaporizer 1.

In accordance with the other aspect of the present invention defined in claim 6, in the invention according to claim 1, a liquid supply control device Q for adjusting a liquid amount to pressure-feed from the raw material receiving tank T to the vaporizer 1 is provided to have a gas pressure at an upstream side of the flow rate control device 2 be no lower than a predetermined pressure value.

In accordance with the other aspect of the present invention defined in claim 7, in the invention according to claim 1, a heating temperature control device M for adjusting a temperature of the vaporizer 1 is provided to have the pressure at the upstream side of the flow rate control device 2 is controlled be no lower than the predetermined pressure.

In accordance with the other aspect of the present invention defined in claim 8, in the invention according to claim 2, a branched supply flow passage of purge gas Gp is connected to a primary side of the flow rate control device 2 and a branched supply flow passage of diluent gas is connected to a secondary side of the flow rate control device 2.

In accordance with the other aspect of the present invention defined in claim 9, in the invention according to claim 1 or claim 2, a metal material that forms the liquid contact parts or the gas contact parts is stainless steel (SUS316L), HASTELLOY (C22), or SPRON (100), a synthetic resin material that forms the liquid contact parts or the gas contact parts is polytetrafluoroethylene (PFA), and the passivation treatment applied to the metal outer surface is $Al_2O_3$ passivation treatment.

In accordance with the other aspect of the present invention defined in claim 10, in the invention according to claim 9, the liquid contact part or the gas contact part of a pressure detector is made of HASTELLOY (C22), sheets of valves are made of polytetrafluoroethylene (PFA), a diaphragm of a control valve of the flow rate control device 2 is made of SPRON (100), and the flow passages and parts constituting other devices are made of stainless steel (SUS316L).

In accordance with the other aspect of the present invention defined in claim 11, in the invention according to claim 9, a heating temperature of the raw material gas G (except diethyl zinc (DEZn) gas) from the flow rate control device 2 is controlled to have a vapor pressure of the raw material gas be no greater than 200 kPa abs.

In accordance with the other aspect of the present invention defined in claim 12, in the invention according to claim 9, a heating temperature of diethyl zinc (DEZn) as the raw material gas G from the flow rate control device 2 is controlled to be no higher than 105° C.

Effects of the Invention

In a vaporizer-type raw material vaporization and supply apparatus according to the present invention, a passivation treatment is applied to liquid contact parts or gas contact parts of at least any of a raw material receiving tank T, a vaporizer 1, a flow rate control device 2, flow passages that connect those component devices, or opening-and-closing valves that are disposed in the flow passages. In a baking-type raw material vaporization and supply apparatus as another embodiment of the present invention, a passivation treatment is applied to liquid contact parts or gas contact parts of at least any of a raw material receiving tank T, a flow rate control device 2, flow passages that connect those component devices, or opening-and-closing valves that are disposed in the flow passages.

This reduces photolytic action of a raw material, in other words, catalytic action to pyrolysis at the liquid contact parts or the gas contact parts that the devices and/or the constituting components such as the pipes have, and pyrolysis of the raw material gas is almost completely inhibited. As a result, not only a heating temperature of the raw material gas may be elevated to supply the raw material gas with a desired high vapor pressure but also the raw material gas with high purity may be stably and continuously vaporized and supplied at a highly precisely controlled gas flow rate. Especially raw material gas of a raw material such as diethyl zinc (DEZn) that is pyrolized at a low temperature by a contact with stainless steel material becomes able to be heated to about 110° C. to supply raw material gas with a high pressure by applying $Al_2O_3$ passivation treatment.

DETAILED DESCRIPTION OF THE INVENTION

Best Mode for Carrying Out the Invention

Hereinafter, referring to drawings, embodiments of the present invention will be explained. The inventors firstly produced a testing device shown in FIG. 1 for evaluating pyrolysis characteristics of various organic metal materials (hereinafter, called MO sources) used for semiconductor manufacturing, and used this device to investigate relations between metal surfaces as well as temperatures thereof and pyrolysis starting temperatures of various MO source gases that contact with the metal surfaces. Here, the metal materials used for the tests are three kinds of metal, i.e. stainless steel (SUS316L), SPRON (100), and HASTELLOY (C22).

Then, relations between the temperatures of the surfaces of the three kinds of metal (gas contact parts) that are subject to $Al_2O_3$ passivation treatment as well as the temperatures of the surfaces of the same three kinds of metal (gas contact parts) that are subject to $Cr_2O_3$ passivation treatment and the pyrolysis starting temperatures of the various MO source gases were respectively checked with the same device. Here, the pyrolysis starting temperature was defined as a temperature where percentage of pyrolized raw material gas reached 5% and the temperature at that moment was defined as a pyrolysis temperature of the raw material gas (DMZn gas, for example).

Figure 1:
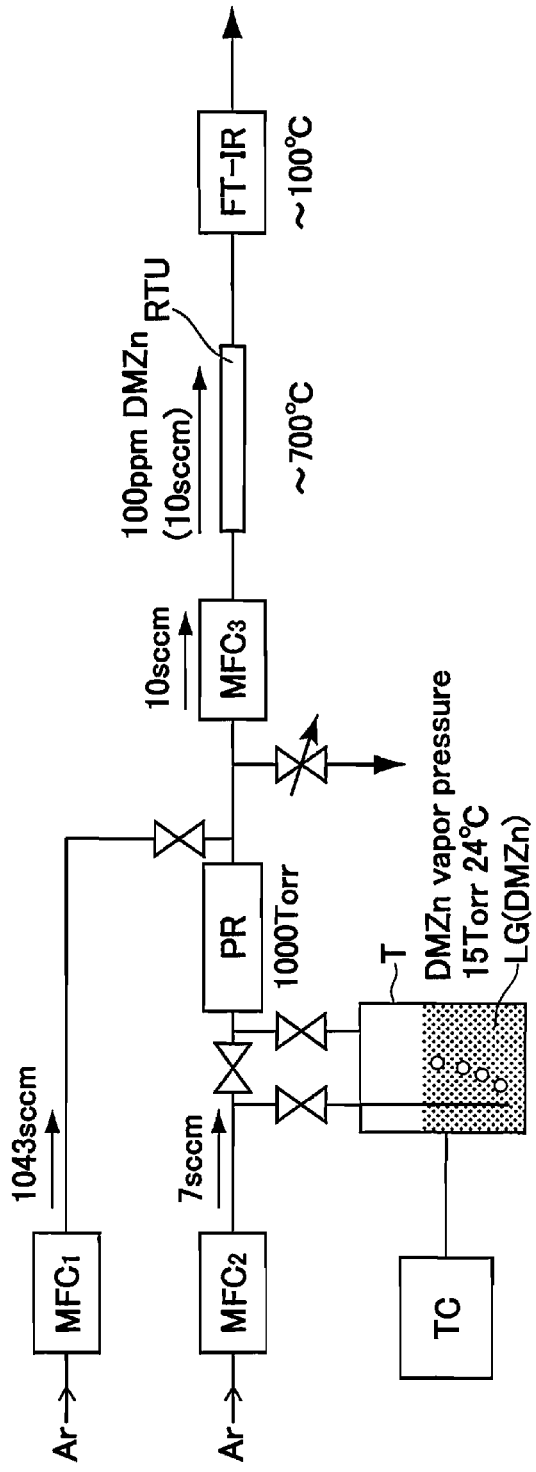
FIG. 1 is a system structure diagram of a testing device that determines pyrolysis characteristics of organic metal materials (also called MO sources)

In FIG. 1, reference symbols $MFC_1$ to $MFC_3$ designate thermal-type flow rate control devices, reference symbol TC designates a tank temperature control device, reference symbol T designates a raw material receiving tank, reference symbol PR designates an internal tank pressure control device, reference symbol RTU designates a reactor tube (test sample), and reference symbol FT-IR designates an infrared spectrophotometer, and the raw material receiving tank T was filled with dimethyl zinc (DMZn, a saturated vapor pressure at 24° C. was 15 Torr). A temperature near the reactor tube RTU and the FT-IR was controlled to be 100° C. to 700° C. by a heating device (not shown).

The raw material gas (DMZn gas) was introduced into the reactor tube RTU from the thermal-type flow rate control device $MFC_3$ by using the so-called bubbling method and a DMZn concentration in the gas flowed through and discharged from the tube was measured by the FT-IR to determine whether pyrolysis of the gas occurred by referring a point where the DMZn concentration dropped from 100% to 95%. In other words, a temperature where the percentage of the pyrolized DMZn reached 5% was defined as a pyrolysis temperature of DMZn gas.

When the tests were conducted, a temperature of the tank was 24° C., a vapor pressure of DMZn was 15 Torr, a bubbling flow rate ($MFC_2$) was 7 sccm, a diluent gas flow rate ($MFC_3$) was 1043 sccm, an internal tank pressure was 1000 Torr, a gas supply flow rate to the reactor tube RTU ($MFC_3$) was 10 sccm, and the DMZn concentration in the gas measured by the FT-IR at that time was 100 ppm. In other words, 10 sccm of the supplied gas contained 100 ppm of DMZn.

Under the above described conditions, the gas was continuously supplied through the thermal-type flow rate control device $MFC_3$ at 10 sccm while raising a temperature of the reactor tube RTU at 2° C. per minute and the DMZn concentration of the gas discharged from the reactor tube RTU was measured by the FT-IR. Five kinds of sample were prepared and used as the reactor tubes RTU: (1) a SUS316L-made pipe (a diameter of 6.35 mm×1000 mm), (2) a HASTELLOY C22-made pipe (a diameter of 6.35 mm×1000 mm), (3) a SUS316L-made pipe (a diameter of 12.7 mm) with an inner surface subjected to $Al_2O_3$ passivation treatment that has a SPRON 100-made specimen put inside thereof, (4) the pipe of (1) with an inner surface subjected to $Al_2O_3$ passivation treatment, and (5) the pipe of (1) with an inner surface subjected to $Cr_2O_3$ passivation treatment.

Here, a $Al_2O_3$ based thin layer with a thickness of 20 to 100 nm was formed by heat-treating the SUS316L-made pipe (a diameter of 6.35 mm×1000 mm) that contained 3 to 6 wt % of aluminum to prepare the sample (4). Similarly, a $Cr_2O_3$ based thin layer with a thickness of 15 to 20 nm was formed by heat-treating the SUS316L-made pipe (a diameter of 6.35 mm×1000 mm) in a low oxygen partial pressure and weakly acidic atmosphere to prepare the sample (5). $Al_2O_3$ passivation treatment and $Cr_2O_3$ passivation treatment are well-known and detailed description about those techniques is omitted here.

Pyrolysis starting temperatures of the raw material liquids LG (MO sources) determined by the testing device shown in FIG. 1 are shown in Table 1 and a pyrolysis starting temperature for each of the raw material liquids LG (MO source) was defined as a temperature where 5% of it was pyrolyzed. Results of tests conducted on specimens made of resin materials (polyimide resin (PI) and polytetrafluoroethylene (PFA)) are also shown in Table 1. The reason for conducting the tests on the resin-made specimens was that there were cases where gas contact parts of some component devices such as valve sheets and/or sealants of valves disposed at an upstream side or a downstream side of a pressure-type flow rate control device were made of the resin materials.

the vaporizing chamber 3 in the vaporizer 1, the each room of the vaporizing chamber 3 may simply be kept empty.

Figure 3:
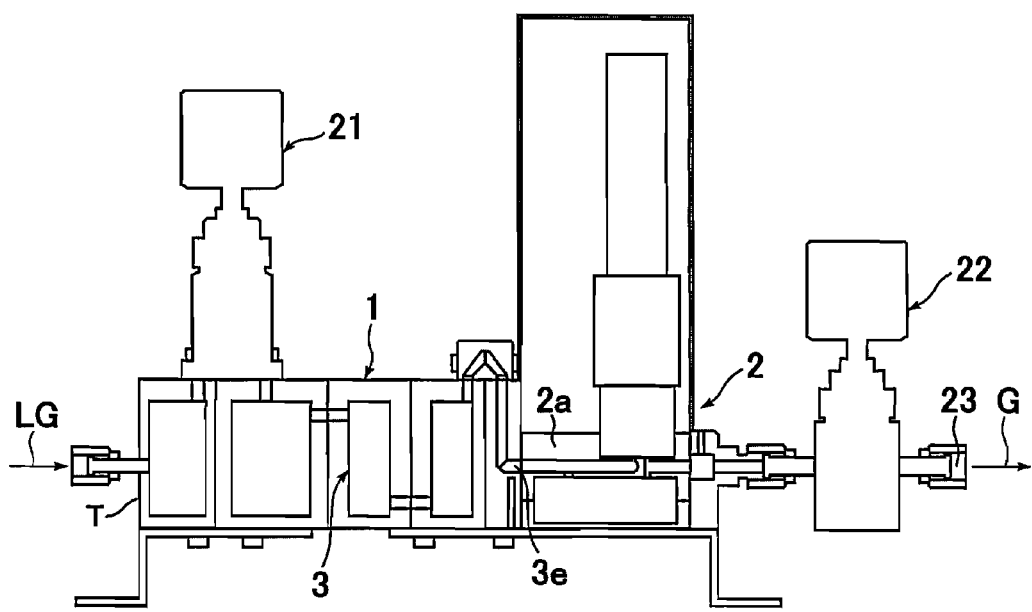
FIG. 3 is a schematic view illustrating a structure of a vaporized gas supply apparatus according to a first embodiment of the present invention.

The high-temperature pressure-type flow rate control device 2 is widely known and a temperature of a device main body 2a is configured to be controllable by a heating device (not shown). In FIG. 3, reference symbol 22 designates a stop valve of a downstream side and reference symbol 23 designates a raw material gas outlet.

In the first embodiment, gas contact parts and liquid contact parts of various component devices such as valve bodies, the vaporizer 1, components such as pipes that constitute flow passages, and the flow rate control device main body 2a are all made of stainless steel (SUS316L) except a pressure detector of the high-temperature pressure-type flow rate control device 2 which is made of HASTELLOY C22, a diaphragm constituting a valve element of the high-temperature pressure-type flow rate control device 2 which is made of SPRON 100, and valve sheets of the liquid supplying valve 21 and the stop valve of a downstream side 22 which are made of PFA.

$Al_2O_3$ passivation treatment is applied to all of the liquid contact parts and/or the gas contact parts of the component

TABLE 1

Results pyrolysis tests (Pyrolysis starting temperature: Temperature where 5% of MO source was pyrolized)

| Raw material | Boiling point | SUS316L | HASTELLOY C22 | SPRON 100 | PI | PFA | $Cr_2O_3$ | $Al_2O_3$ | Heating temperature (vapor pressure of 200 kPa abs) |
|---|---|---|---|---|---|---|---|---|---|
| TMAl | 127.1° C. | 320° C. | 324° C. | 332° C. | 88° C. | >250° C. | 360° C. | 372° C. | 150° C. |
| TMIn | 136.0° C. | 92° C. | 124° C. | 110° C. | <RT | >250° C. | 144° C. | >250° C. | 150° C. |
| DMZn | 46.0° C. | 140° C. | 240° C. | 240° C. | 68° C. | >250° C. | 252° C. | 328° C. | 70° C. |
| DEZn | 117.6° C. | 44° C. | 52° C. | 54° C. | 84° C. | 128° C. | 88° C. | 108° C. | 140° C. |

As clearly shown in Table 1, in case the raw material liquid (MO source) is DEZn or DMZn, the pyrolysis starting temperature of the MO source is greatly raised by application of $Al_2O_3$ passivation treatment or $Cr_2O_3$ passivation treatment, and high temperature heating of the MO source becomes possible. This also means that supply of the raw material gas G with a high vapor pressure of around 200 kPa abs becomes possible.

Figure 2:
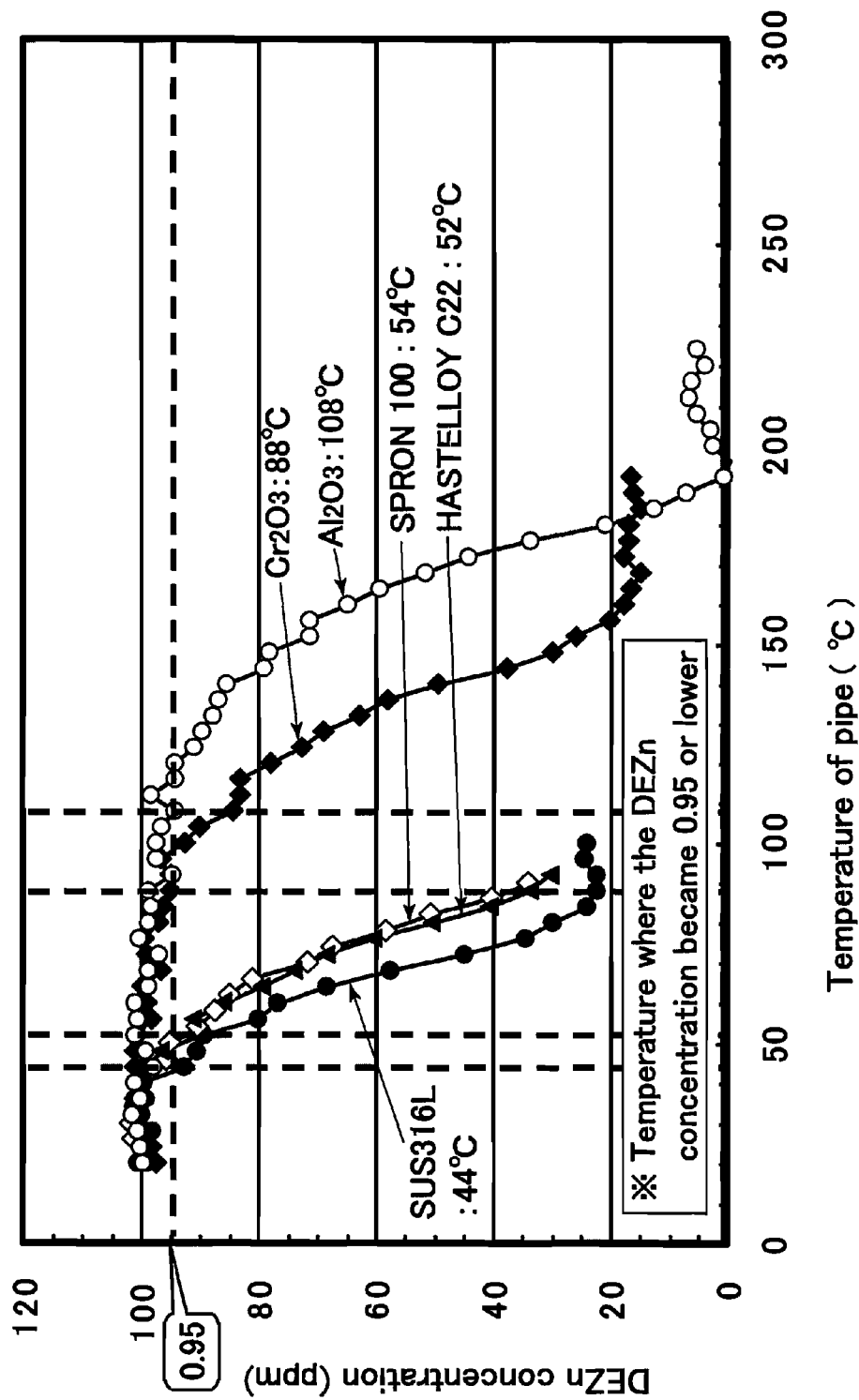
FIG. 2 is a graph showing curbs of pyrolysis characteristics of diethyl zinc (DEZn) for various materials that form gas contact parts.

FIG. 2 is a graph showing measurement results of the tests for pyrolysis characteristics of DEZn as the raw material liquid (MO source) and it shows that $Al_2O_3$ passivation treatment is effective for raising the pyrolysis starting temperature in case the raw material is DEZn gas.

[Embodiment] 1 A first embodiment of the present invention is shown in FIG. 3 and a raw material vaporization and supply apparatus includes a raw material receiving tank T, a liquid supplying valve 21, a vaporizer 1, and a high-temperature pressure-type flow rate control device 2, wherein the liquid supplying valve 21 is disposed between the raw material receiving tank T and the vaporizer 1. There is also a heating device (not shown) provided to the raw material receiving tank T.

The vaporizer 1 has a vaporizing chamber 3, an internal space of which is divided into a plurality of rooms (three rooms in the embodiment), and a block body for promoting vaporization (not shown) and a heating device for heating inside of the vaporizing chamber 3 (not shown) are disposed in each of the rooms. Vaporized raw material gas G flows from a gas outlet 3e into the high-temperature pressure-type flow rate control device 2. Here, although the block body and the heating device are disposed in each of the rooms of devices made of stainless steel (SUS316L), HASTELLOY C22, and SPRON 100, and $Al_2O_3$ based thin layers with an average thickness of 20 nm are evenly formed on whole of the liquid contact parts and/or the gas contact parts. Although $Al_2O_3$ passivation treatment is applied in the first embodiment, $Cr_2O_3$ passivation treatment may be applied instead. According to circumstances, applying $Al_2O_3$ passivation treatment to some component devices while applying $Cr_2O_3$ passivation treatment to rest of the component devices is also possible.

In the first embodiment, although $Al_2O_3$ passivation treatment is applied to all the liquid contact parts and/or the gas contact parts including the HASTELLOY C22-made diaphragm used in the pressure detector of the high-temperature pressure-type flow rate control device 2 and the SPRON 100-made diaphragm of a control valve, fluororesin coating may be applied to the liquid contact parts and/or the gas contact parts of the HASTELLOY C22-made diaphragm and SPRON 100-made diaphragm instead of $Al_2O_3$ passivation treatment.

According to the first embodiment, as shown in Table 1, in case the raw material liquid LG is, for example, DEZn, a percentage of DEZn gas pyrolized is kept within 5% even when the liquid contact metal parts or the gas contact metal parts is heated to 108° C., and this enables DEZn gas with a high vapor pressure near 200 kPa abs to be stably supplied.

Figure 4:
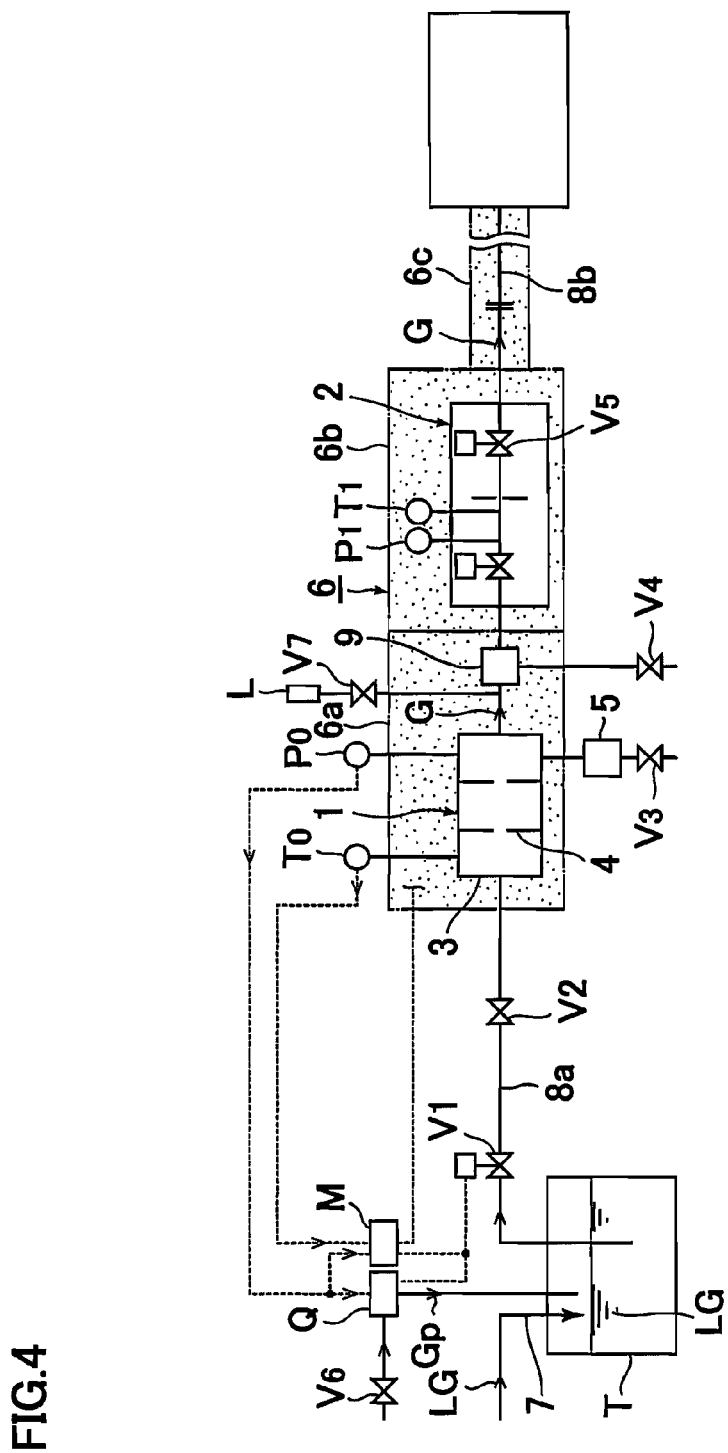
FIG. 4 is a schematic view illustrating a structure of a vaporized gas supply apparatus according to a second embodiment of the present invention.
Figure 9:
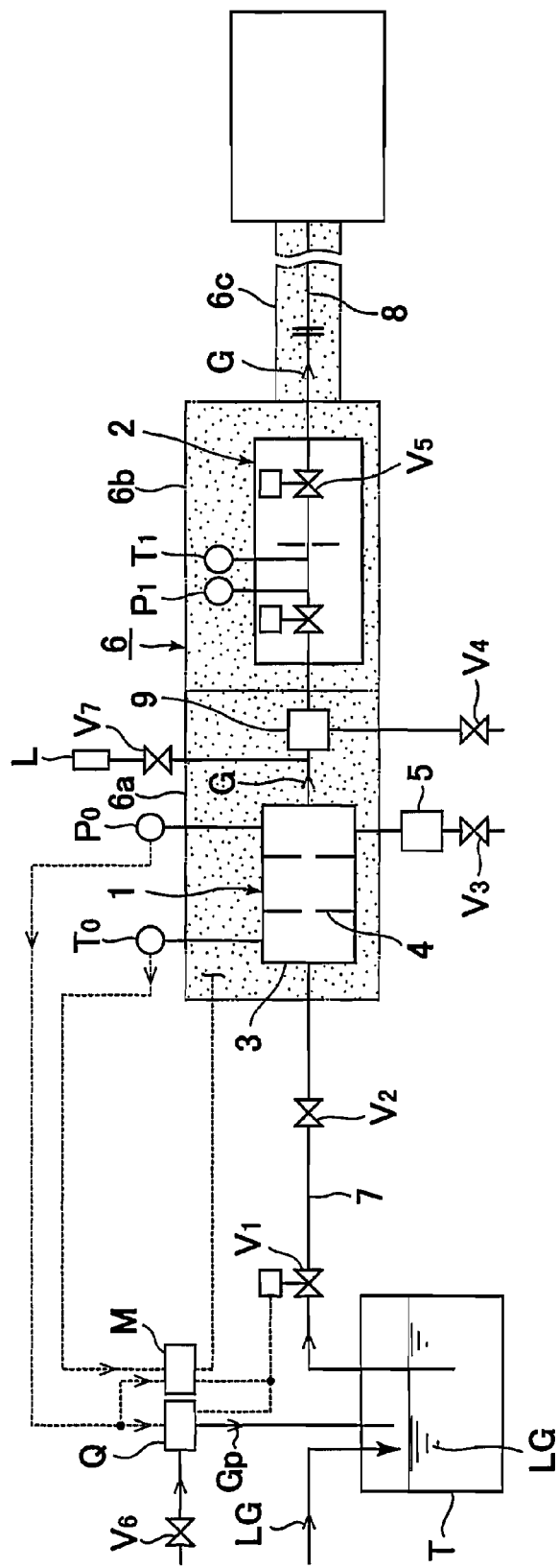
FIG. 9 is a system structure diagram of a conventional raw material vaporization and supply apparatus (Patent document 2)
Figure 10:
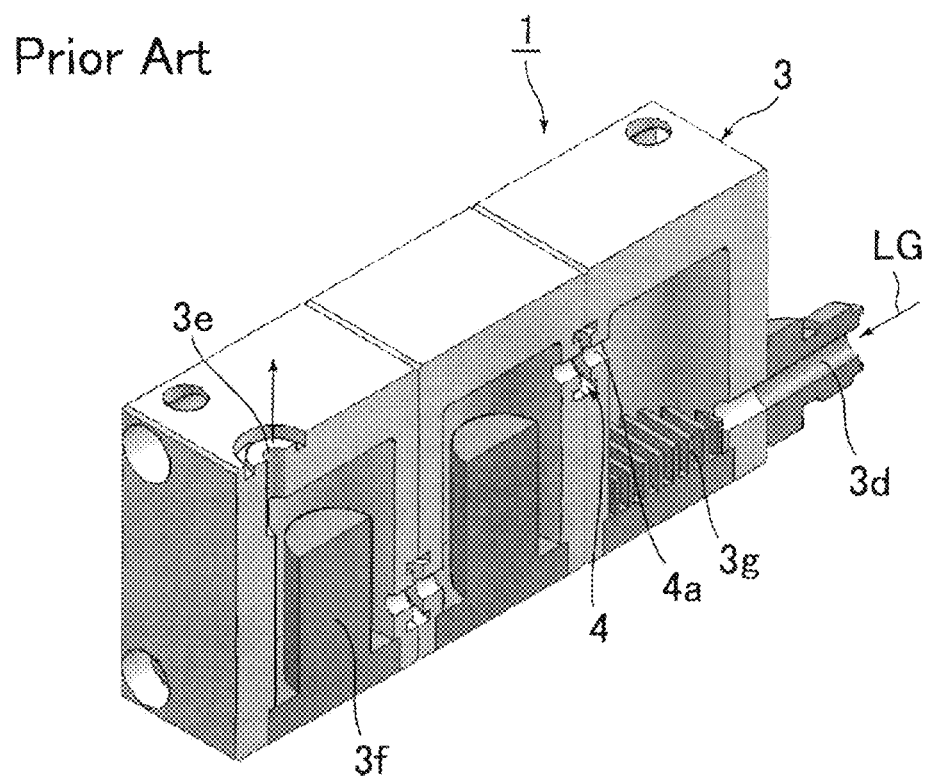
FIG. 10 is a schematic perspective view of a longitudinal section of a vaporizer used in the conventional raw material vaporization and supply apparatus.
Figure 11:
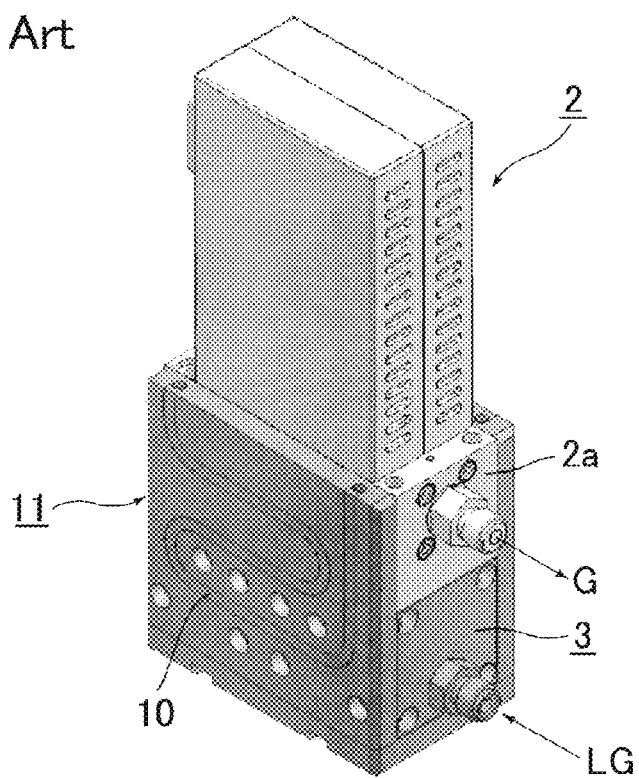
FIG. 11 is a schematic perspective view of a longitudinal section of a combined body of the vaporizer and a high-temperature pressure-type flow rate control device that are used in the conventional raw material vaporization and supply apparatus to show how the vaporizer and the high-temperature pressure-type flow rate control device are combined.

[Embodiment] 2 FIG. 4 is a block diagram illustrating a structure of a raw material vaporization and supply apparatus according to a second embodiment of the present invention and the structure of the raw material vaporization and supply apparatus is the same as a structure of a conventional apparatus shown in FIGS. 9 to 11. Also in the second embodiment, gas contact parts and liquid contact parts of various component devices such as valve bodies, a vaporizer 1, components such as pipes constituting flow passages, and a flow rate control device main body 2a are all made of stainless steel (SUS316L) except a pressure detector of a high-temperature pressure-type flow rate control device 2 which is made of HASTELLOY C22, a diaphragm constituting a valve element of the high-temperature pressure-type flow rate control device 2 which is made of SPRON 100, and valve sheets of a liquid supplying valve 21 and a stop valve of a downstream side 22 which are made of PFA.

Furthermore, $Al_2O_3$ passivation treatment and/or $Cr_2O_3$ passivation treatment is applied to all of the liquid contact parts and/or the gas contact parts of the devices constituting the apparatus that are formed by stainless steel (SUS316L), HASTELLOY C22, and SPRON 100, and $Al_2O_3$ based thin layers with an average thickness of 20 nm are evenly formed on whole of the gas contact parts. This is what is different from the conventional raw material vaporization and supply apparatus shown in FIGS. 9 to 11.

Figure 5:
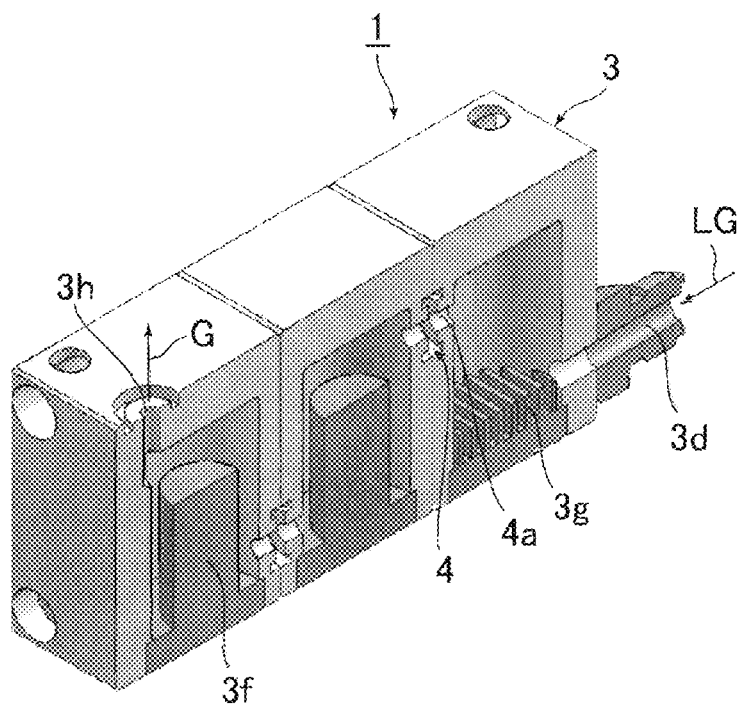
FIG. 5 is a schematic perspective view of a longitudinal section of a vaporizer used in the second embodiment of the present invention.
Figure 6:
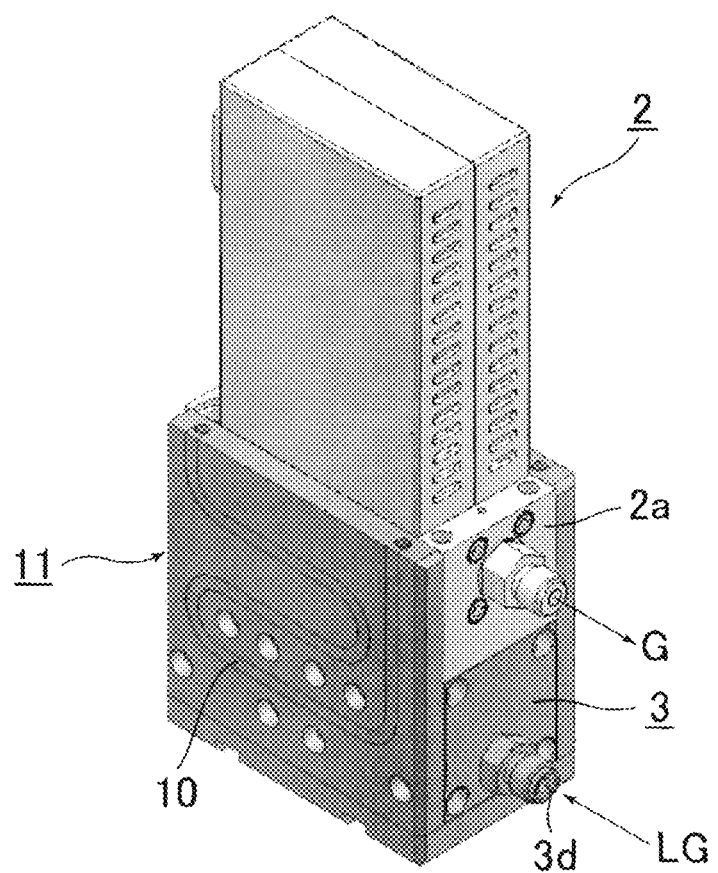
FIG. 6 is a schematic perspective view illustrating how the vaporizer and a flow rate control device used in the second embodiment are combined.

In FIGS. 4 to 6, reference symbol T designates a raw material receiving tank, reference symbol Q designates a supply flow rate control device, reference symbol 1 designates the vaporizer, reference symbol 2 designates the high-temperature pressure-type flow rate control device, reference symbol 2a designates the main body of the flow rate control device, reference symbol 3 designates a vaporizing chamber, reference symbol 3d designates a raw material liquid inlet, reference symbols 3f and 3g designate heating promoters, reference symbol 3h designates a gas outlet, reference symbol 4 designates a pulsation reducing orifice, reference symbol 4a designates a hole, reference symbol 6 (6a, 6b, 6c) designates a heating device, reference symbols 7, 8a, and 8b designate flow passages, reference symbol 10 designate a heater, reference symbol 11 designate a heating board, reference symbol M designate a heating temperature control device, reference symbol $V_1$ designate a fluid supply flow rate control valve, reference symbol L designate a relief valve, reference symbol Gp designates gas for pressurizing the raw material receiving tank, reference symbol LG designates raw material liquid, reference symbol G designates raw material gas, reference symbols $T_0$ and $T_1$ designate temperature detectors, reference symbols $V_2$ to $V_7$ designate opening-and-closing valves, and reference symbols $P_0$ and $P_1$ designate pressure detectors. Operation of the raw material vaporizing and supply apparatus which is the same as operation of the conventional raw material vaporizing and supply apparatus shown in FIGS. 9 to 11 is not described here.

Figure 7:
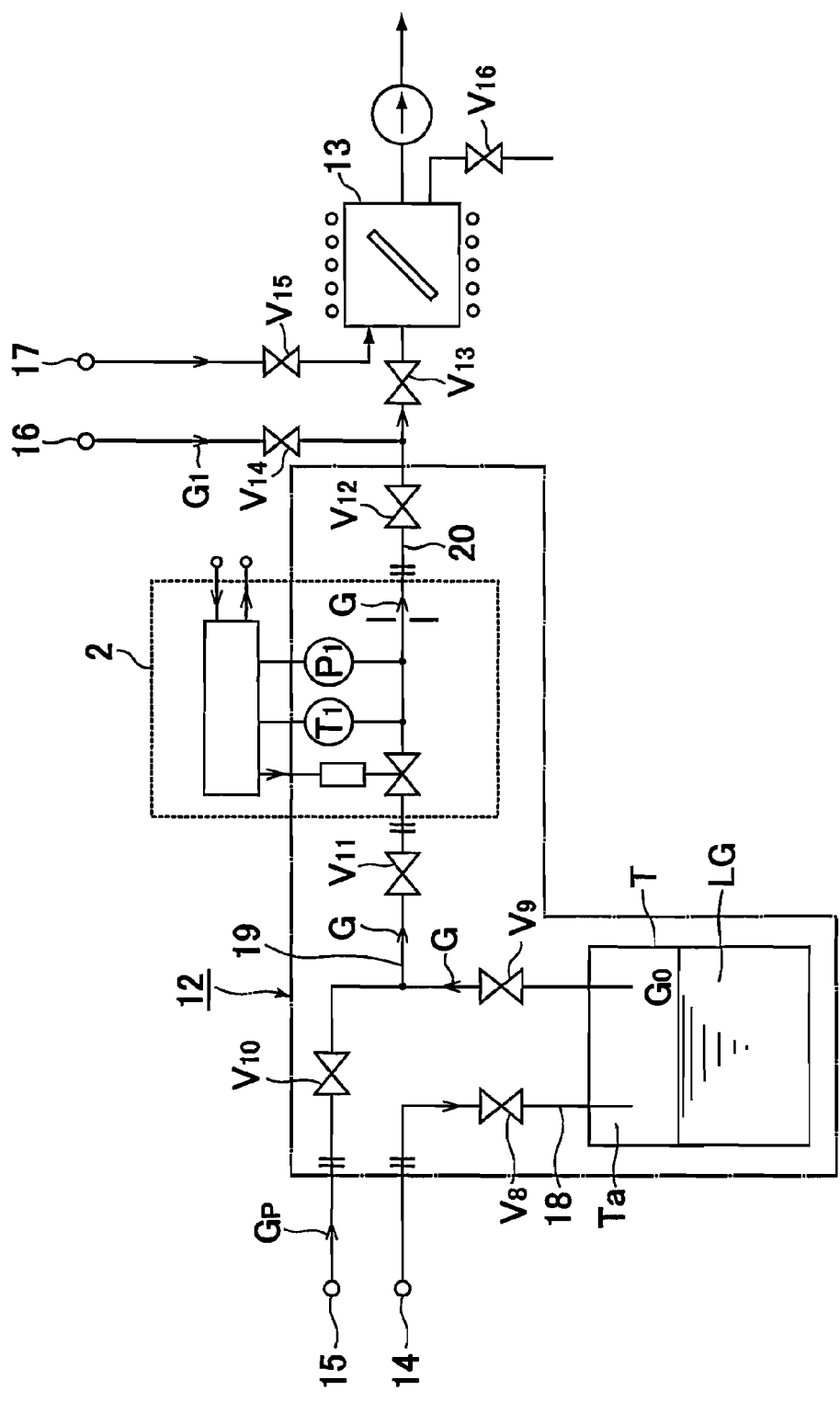
FIG. 7 is a schematic view illustrating a structure of a vaporized gas supply apparatus according to a third embodiment of the present invention.
Figure 12:
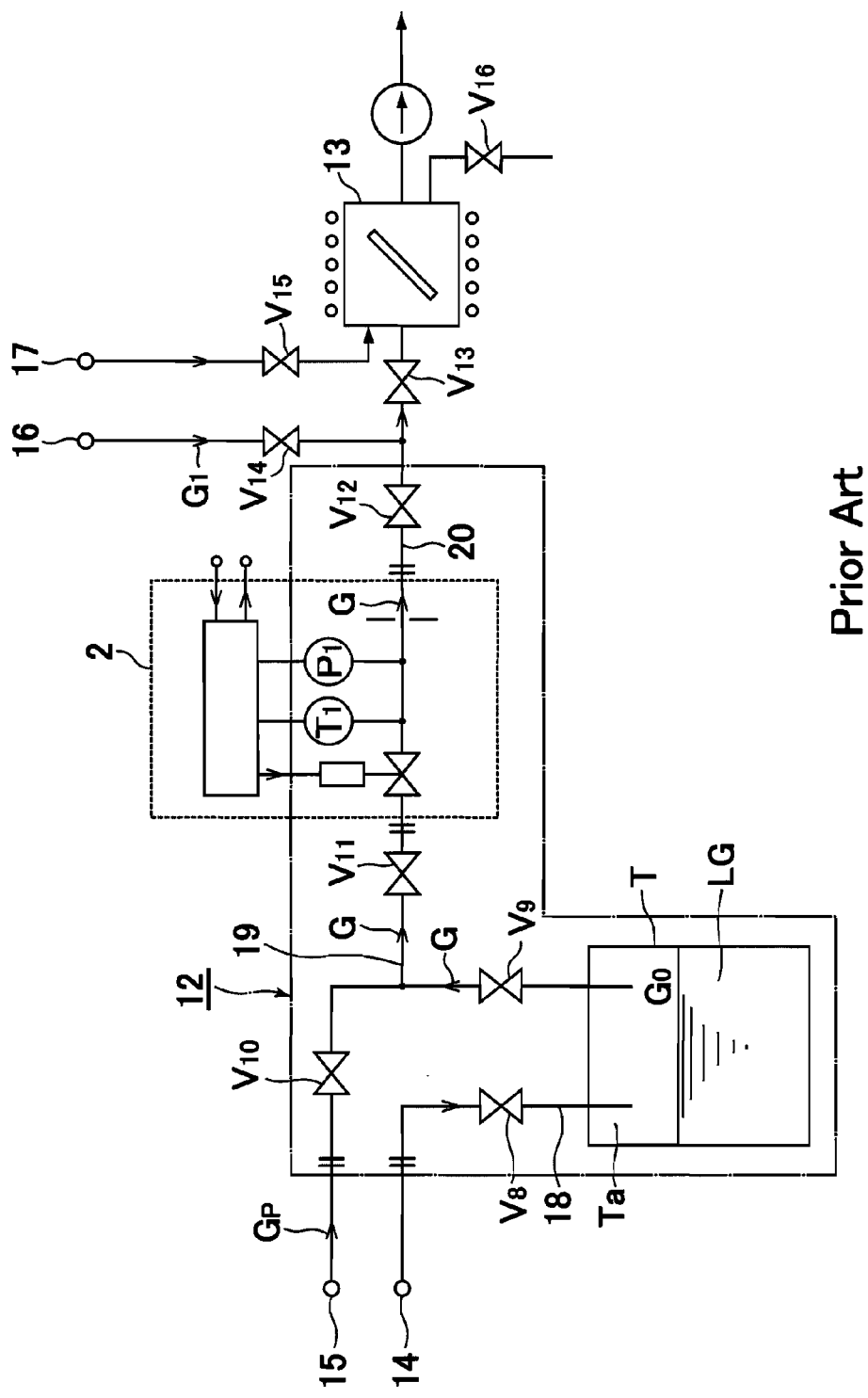
FIG. 12 is a system structure diagram of a baking-type raw material vaporization and supply apparatus according to a prior invention by the applicant.
Figure 13:
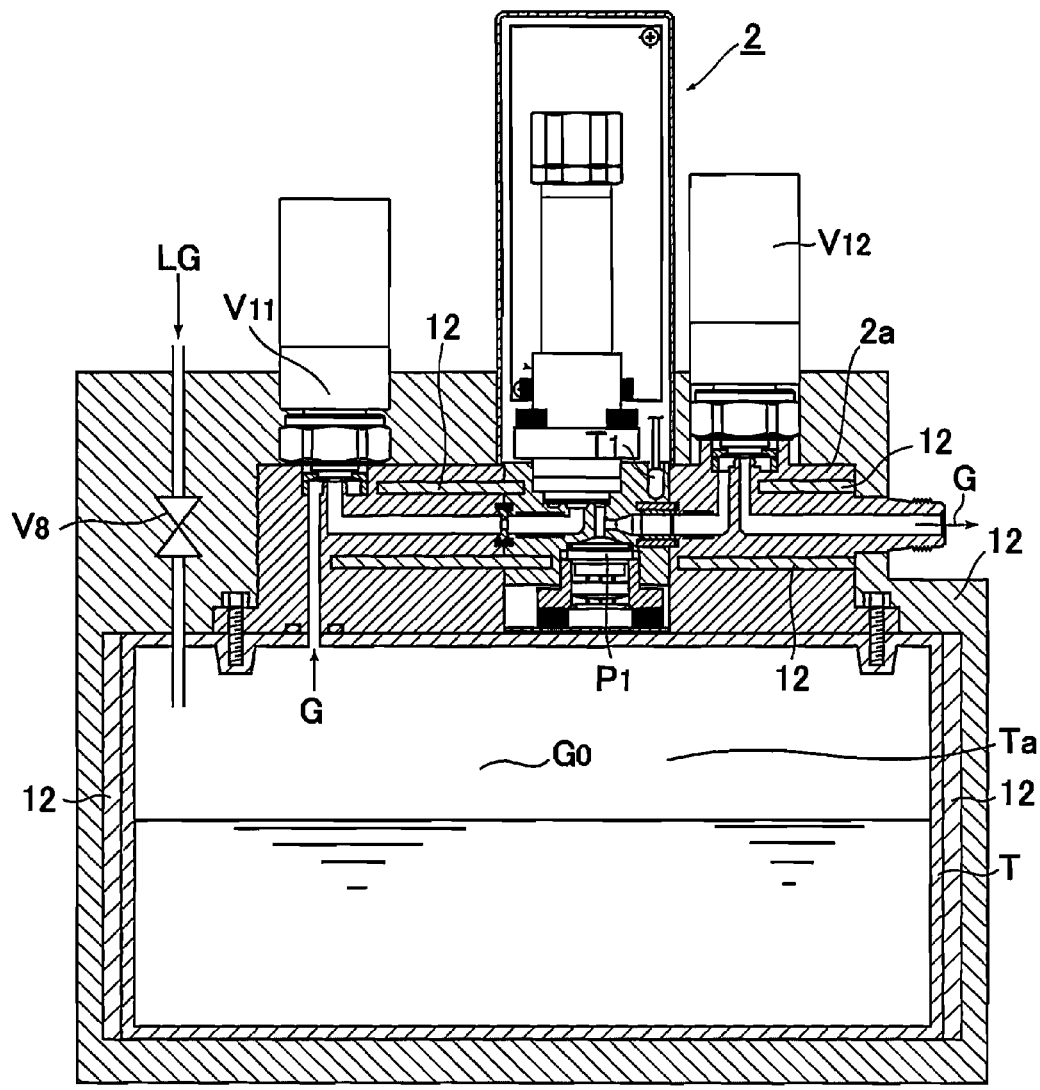
FIG. 13 is a schematic view of a longitudinal section of a combined body of a vaporizer and a high-temperature pressure-type flow rate control device used in the baking-type raw material vaporization and supply apparatus according to the prior invention by the applicant to show how the vaporizer and the high-temperature pressure-type flow rate control device are combined.

[Embodiment] 3 FIG. 7 is a block diagram illustrating a structure of a raw material vaporization and supply apparatus according to a third embodiment of the present invention and the structure of the raw material vaporization and supply apparatus is the same as a structure shown in FIG. 12. Also in the third embodiment, gas contact parts as well as liquid contact parts of various component devices such as valve bodies, a vaporizer 1, parts constituting flow passages, and a flow rate control device main body 2a are all made of stainless steel (SUS316L) except a pressure detector of a high-temperature pressure-type flow rate control device 2 which is made of HASTELLOY C22, a diaphragm constituting a valve element of the high-temperature pressure-type flow rate control device 2 which is made of SPRON 100, and valve sheets of a liquid supplying valve 21 and a stop valve of a downstream side 22 which are made of PFA.

Furthermore, $Al_2O_3$ passivation treatment is applied to all of the liquid contact parts and/or the gas contact parts of the devices constituting the apparatus which are formed by stainless steel (SUS316L), HASTELLOY C22, and SPRON 100, and $Al_2O_3$ based thin layers with an average thickness of 20 nm are evenly formed on whole of the gas contact parts. This is what is different from the conventional raw material vaporization and supply apparatus shown in FIG. 12.

Figure 8:
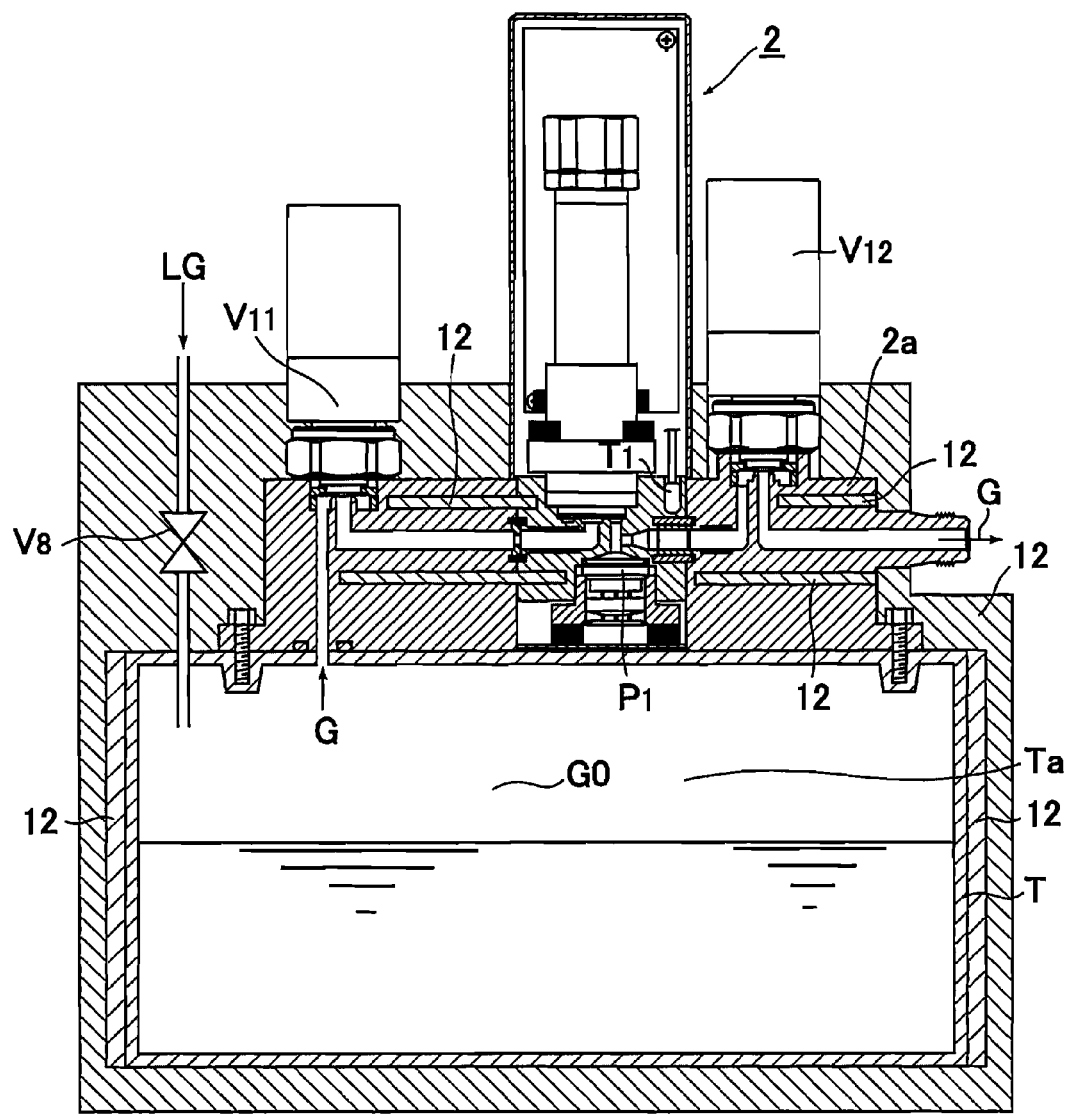
FIG. 8 is a schematic view of a longitudinal section of a combined body of a vaporizer and a flow rate control device used in the third embodiment of the present invention to show how the vaporizer and the flow rate control device are combined.

The raw material vaporization and supply apparatus according to the third embodiment shown in FIG. 7 and FIG. 8 includes a raw material receiving tank T that stores raw material liquid LG, a constant temperature heating device 12 that heats the raw material receiving tank T etc., and the pressure-type flow rate control device 2 that controls a flow rate of raw material gas G which is supplied from an internal upper space Ta of the raw material receiving tank T to a process chamber 13. Here, in FIG. 7 and FIG. 8, reference symbol 14 designates a raw material liquid supply port, reference symbol 15 designates a purge gas supply port, reference symbol 16 designates a diluent gas supply port, reference symbol 17 designates a gas supply port for another thin-layer forming gas, and reference symbols $V_8$ to $V_{16}$ designate valves. Operation of the raw material vaporizing and supply apparatus which is the same as operation of the conventional raw material vaporizing and supply apparatus shown in FIG. 12 is not described here.

In the raw material vaporization and supply apparatus according to the present invention, since $Al_2O_3$ passivation treatment or $Cr_2O_3$ passivation treatment is applied to all of the metal gas contact parts formed by SUS316L etc, so-called catalytic action to pyrolysis to raw material gas at gas contact parts formed by SUS316L etc. is greatly reduced. As shown in Table 1, especially diethyl zinc (DEZn) which is an organic metal raw material liquid and pyrolized at a temperature of the SUS316L material surface which is below a boiling point of the raw material becomes possible to be heated to a high temperature of 100° C. to 110° C. As a result, the raw material gas (DEZn gas) with high purity as well as a high vapor pressure becomes able to be continuously and stably supplied to achieve utility that has not been attainable by the conventional raw material vaporization and supply apparatuses.

INDUSTRIAL APPLICABILITY

The present invention is applicable not only to a raw material vaporization and supply apparatus used for the MOCVD method, but also to any gas supply apparatus configured for supplying gas from a pressurized storage source to a process chamber in semiconductor manufacturing equipment, chemical products manufacturing equipment, or the like.

DESCRIPTION OF THE REFERENCE NUMERAL

T: Raw material receiving tank
Ta: Internal upper space of the tank
LG: Raw material liquid (MO source)
G: Raw material gas
Go: Raw material vapor (saturated vapor)
Gp: Gas for pressurizing the raw material receiving tank
PG: Purge gas
$MFC_1$ to $MFC_3$: Thermal-type flow rate control device (Mass flow controller)
$V_1$: Fluid supply flow rate control valve
$V_2$ to $V_7$: Opening-and-closing valve
Q: Liquid supply flow rate control device M: Heating temperature control device
L: Relief valve
$T_0$ to $T_1$: Temperature detector
$P_0$ to $P_1$: Pressure detector
Tc: Tank temperature control device
Pr: Pressure control device
RTU: Reactor tube
FT-IR: Infrared spectrophotometer
1: Vaporizer
2: High-temperature pressure-type flow rate control device
2a: Flow rate control device main body
2b: Piezo driving portion
2c: Insulation shaft
3: Vaporizing chamber
3d: Liquid inlet
3e: Gas outlet
3f to 3g: Heating promoter
4: Pulsation reducing orifice
4a: Hole
5: Liquid storing part
6 (6a to 6c): Heating device
7: Flow passage
8 (8a to 8b): Flow passage
9: Buffer tank
10: Heater
11: Heating board
12: Constant temperature heating device
13: Process chamber
14: Raw material liquid supply port
15: Purge gas supply port
16: Diluent gas supply port
17: Gas supply port for a thin-layer forming gas
18: Flow passage
19: Flow passage
20: Flow passage
21: Liquid supplying valve
22: Stop valve of a downstream side
23: Raw material gas outlet

The invention claimed is:
1. A raw material vaporization and supply apparatus comprising:
a raw material receiving tank;
a vaporizer for vaporizing liquid pressure-fed from the raw material receiving tank;
a flow rate control device for adjusting a flow rate of raw material gas from the vaporizer; and
a heating device for heating the vaporizer, the flow rate control device, and desired sections of flow passages connected to these component devices,
wherein a passivation treatment is applied to liquid contact parts or gas contact parts of metal surfaces of at least any of the raw material receiving tank, the vaporizer, the flow rate control device, the flow passages connected to these component devices, or opening-and-closing valves that are disposed in the flow passages:
wherein a metal material that forms the liquid contact parts or the gas contact parts is stainless steel (SUS316L), HASTELLOY (C22) or SPRON (100) a synthetic resin material that forms the liquid contact parts or the gas contact parts is polytetrafluoroethylene (PFA), and the passivation treatment applied to the metal outer surfaces is $Al_2O_3$ passivation treatment;
wherein the liquid contact parts or the gas contact parts of a pressure detector are made of HASTELLOY (C22), sheets of valves are made of polytetrafluoroethylene (PFA), a diaphragm of a control valve of the flow rate control device is made of SPRON (100), and the flow passages and components of other devices are made of stainless steel (SUS316L).

2. The raw material vaporization and supply apparatus according to claim 1, wherein the passivation treatment applied to the liquid contact parts or the gas contact parts of the metal surfaces is $Al_2O_3$ passivation treatment, $Cr_2O_3$ passivation treatment, or $FeF_2$ passivation treatment.

3. The raw material vaporization and supply apparatus according to claim 1, wherein the flow rate control device is a high-temperature pressure-type flow rate control device.

4. The raw material vaporization and supply apparatus according to claim 1, wherein a main body of the flow rate control device is mounted on top of a vaporizing chamber of the vaporizer.

5. The raw material vaporization and supply apparatus according to claim 1, wherein a liquid supply control device for adjusting a liquid amount to pressure-feed to the vaporizer from the raw material receiving tank is provided to have a gas pressure at an upstream side of the flow rate control device be no lower than a predetermined pressure.

6. The raw material vaporization and supply apparatus according to claim 1, wherein a temperature control device for adjusting a heating temperature of the vaporizer is provided to have the pressure at the upstream side of the flow rate control device be no lower than the predetermined pressure.

7. The raw material vaporization and supply apparatus according to claim 1, wherein a heating temperature of the raw material gas (except diethyl zinc (DEZn) gas) from the flow rate control device is controlled to have a vapor pressure of the raw material gas be no greater 200 kPa abs.

8. The raw material vaporization and supply apparatus according to claim 1, wherein a heating temperature of diethyl zinc (DEZn) gas as raw material gas G from the flow rate control device is controlled to be no higher than 105° C.

9. A raw material vaporization and supply apparatus comprising:
a raw material receiving tank that stores a raw material;
a flow passage for supplying the raw material to the raw material receiving tank;
raw material gas flow passages for supplying raw material gas from an internal upper space of the raw material receiving tank to a process chamber;
a flow rate control device for controlling a flow rate of the raw material gas to supply to the process chamber; and
a constant temperature heating device for heating the raw material receiving tank, the raw material gas flow passages, and the flow rate control device to a predetermined temperature,
wherein a passivation treatment is applied to liquid contact parts or gas contact parts of metal surfaces of at least any of the raw material receiving tank, the flow rate control device, the flow passages connected to these component devices, or opening-and-closing valves that are disposed in the flow passages;
wherein a branched supply flow passage of purge gas is connected to a primary side of the flow rate control device and a branched supply flow passage of diluent gas is connected to a secondary side of the flow rate control device.

10. The raw material vaporization and supply apparatus according to claim 9, wherein the passivation treatment applied to the liquid contact parts or the gas contact parts of the metal surfaces is $Al_2O_3$ passivation treatment, $Cr_2O_3$ passivation treatment, or $FeF_2$ passivation treatment.

11. The raw material vaporization and supply apparatus according to claim 9, wherein the flow rate control device is a high-temperature pressure-type flow rate control device.

12. A raw material vaporization and supply apparatus comprising:
   a raw material receiving tank that stores a raw material;
   a flow passage for supplying the raw material to the raw material receiving tank;
   raw material gas flow passages for supplying raw material gas from an internal upper space of the raw material receiving tank to a process chamber;
   a flow rate control device for controlling a flow rate of the raw material gas to supply to the process chamber; and
   a constant temperature heating device for heating the raw material receiving tank, the raw material gas flow passages, and the flow rate control device to a predetermined temperature,
   wherein a passivation treatment is applied to liquid contact parts or gas contact parts of metal surfaces of at least any of the raw material receiving tank, the flow rate control device, the flow passages connected to these component devices, or opening-and-closing valves that are disposed in the flow passages,
   wherein a metal material that forms the liquid contact parts or the gas contact parts is stainless steel (SUS316L), HASTELLOY (C22), or SPRON (100), a synthetic resin material that forms the liquid contact parts or the gas contact parts is polytetrafluoroethylene (PFA), and the passivation treatment applied to the metal outer surfaces is $Al_2O_3$ passivation treatment
   wherein the liquid contact parts or the gas contact parts of a pressure detector are made of HASTELLOY (C22), sheets of valves are made of polytetrafluoroethylene (PFA), a diaphragm of a control valve of the flow rate control device is made of SPRON (100), and the flow passages and components of other devices are made of stainless steel (SUS316L).

13. The raw material vaporization and supply apparatus according to claim 12, wherein a heating temperature of the raw material gas (except diethyl zinc (DEZn) gas) from the flow rate control device is controlled to have a vapor pressure of the raw material gas be no greater 200 kPa abs.

14. The raw material vaporization and supply apparatus according to claim 12, wherein a heating temperature of diethyl zinc (DEZn) gas as raw material gas G from the flow rate control device is controlled to be no higher than 105° C.

* * * * *